(12) United States Patent
Lee et al.

(10) Patent No.: US 9,294,990 B2
(45) Date of Patent: Mar. 22, 2016

(54) CHANNEL SEARCHING METHOD AND APPARATUS FOR RECEIVING BROADCAST SIGNAL USING THE SAME

(71) Applicant: SAMSUNG ELECTRO-MECHANICS CO., LTD., Suwon-Si, Gyeonggi-do (KR)

(72) Inventors: Kyo Sang Lee, Suwon-Si (KR); Hyung Bong Jeon, Suwon-Si (KR); Ju Ho Lee, Suwon-Si (KR); Si Young Kwon, Suwon-Si (KR); Dong Jin Yoon, Suwon-Si (KR); Nam Min Kim, Suwon-Si (KR); In Jong Jang, Suwon-Si (KR); Tae Gyu Ryu, Suwon-Si (KR); Jae Soon Lee, Suwon-Si (KR)

(73) Assignee: SOLUM CO., LTD., Gyeonggi-do, Suwon-si (KR)

( * ) Notice: Subject to any disclaimer, the term of this patent is extended or adjusted under 35 U.S.C. 154(b) by 0 days.

(21) Appl. No.: 14/297,068

(22) Filed: Jun. 5, 2014

(65) Prior Publication Data

US 2015/0189576 A1 Jul. 2, 2015

(30) Foreign Application Priority Data

Dec. 30, 2013 (KR) ........................ 10-2013-0166590

(51) Int. Cl.
*H04W 48/16* (2009.01)

(52) U.S. Cl.
CPC ..................................... *H04W 48/16* (2013.01)

(58) Field of Classification Search
CPC ..... H04W 52/52; H04W 48/16; H03G 3/3068
See application file for complete search history.

(56) References Cited

U.S. PATENT DOCUMENTS

| 2007/0060085 | A1* | 3/2007 | Choi ........................... 455/185.1 |
| 2008/0233915 | A1* | 9/2008 | Saito et al. .................... 455/334 |
| 2009/0141838 | A1 | 6/2009 | Han et al. |
| 2009/0197554 | A1* | 8/2009 | Shi et al. ..................... 455/226.2 |
| 2013/0100885 | A1* | 4/2013 | Ngai et al. ........... H04B 7/0877 370/328 |

FOREIGN PATENT DOCUMENTS

| KR | 10-2009-0054695 A | 6/2009 |
| KR | 10-2010-0022778 A | 3/2010 |

* cited by examiner

*Primary Examiner* — Marisol Figueroa
(74) *Attorney, Agent, or Firm* — McDermott Will & Emery LLP

(57) ABSTRACT

A channel searching method may include setting a first channel in a broadcast signal, determining signal strength of the broadcast signal and generating an automatic gain control signal for the first channel, and when the signal strength satisfies a preset first requirement and the automatic gain control signal satisfies a preset second requirement, skipping demodulation of the first channel.

13 Claims, 4 Drawing Sheets

CHANNEL SEARCHING METHOD AND APPARATUS FOR RECEIVING BROADCAST SIGNAL USING THE SAME

CROSS-REFERENCE TO RELATED APPLICATION

This application claims the benefit of Korean Patent Application No. 10-2013-0166590 filed on Dec. 30, 2013, with the Korean Intellectual Property Office, the disclosure of which is incorporated herein by reference.

BACKGROUND

The present disclosure relates to a channel searching method and an apparatus for receiving a broadcast signal using the same.

In accordance with the development of electronics technology, a broadcast signal receiving function has been used in various electronic devices. Particularly, an apparatus for receiving a broadcast signal has been used in mobile devices such as smart phones.

The apparatus for receiving a broadcast signal generally receives the broadcast signal by sequentially demodulating and decoding respective channels of a broadcast signal having a plurality of channels.

For example, according to the related art, respective channels of a broadcast signal have necessarily been demodulated and the demodulated channels have been decoded. Next, a method for storing or setting channels by determining whether or not the broadcast signal is present in corresponding channels according to the decoding result has been widely used.

However, the method according to the related art has a problem in that demodulation and decoding should be performed, even in the case of channels in which the signal is not present. In addition, since a predetermined time is required to perform the demodulation and the decoding, a predetermined time is also required for searching channels in which the signal is not present.

Patent Document 1 relates to a channel searching method of an apparatus for receiving a broadcast signal and Patent Document 2 relates to an apparatus and a method for automatically changing a digital multimedia broadcasting channel in a mobile terminal. However, Patent Documents 1 and 2 still have the above-mentioned problems.

RELATED ART DOCUMENT (Patent Document 1) Korean Patent Laid-Open Publication No. 10-2010-0022778
(Patent Document 2) Korean Patent Laid-Open Publication No. 10-2009-0054695

SUMMARY

Some embodiments of the present disclosure may provide a channel searching method allowing for more rapid searching of a channel by determining whether or not effective broadcast data is present in a corresponding channel using a signal strength of a broadcast signal and an automatic gain control signal of the channel and when the broadcast data is not present in the corresponding channel, by skipping the corresponding channel, and an apparatus for receiving a broadcast signal using the same.

According to some embodiments of the present disclosure, a channel searching method may include setting a first channel in a broadcast signal, determining signal strength of the broadcast signal and generating an automatic gain control signal for the first channel, and when the signal strength satisfies a preset first requirement and the automatic gain control signal satisfies a preset second requirement, skipping demodulation of the first channel.

The skipping of the demodulation of the first channel may include determining whether or not the signal strength is below a preset first reference value, when the signal strength is below the first reference value, determining whether or not the automatic gain control signal is equal to a preset second reference value or above, and when the automatic gain control signal is equal to the preset second reference value or above, skipping the demodulation of the first channel.

The channel searching method may further include, when skipping the demodulating for the first channel, setting a second channel and repetitively determining whether or not demodulating of the second channel should be skipped.

The channel searching method may further include, when the signal strength satisfies the first requirement or the automatic gain control signal satisfies the second requirement, demodulating the first channel.

The demodulating of the first channel may include when the signal strength satisfies the first requirement or the automatic gain control signal satisfies the second requirement, determining whether or not the demodulation is locked for the first channel, and when the demodulation is locked, determining whether or not decoding is locked for locked demodulation data.

The demodulating of the first channel may further include storing the first channel when the decoding is locked.

According to some embodiments of the present disclosure, an apparatus for receiving a broadcast signal may include a radio frequency (RF) receiving unit receiving a broadcast signal and detecting signal strength of the broadcast signal, a demodulating unit setting a first channel in the broadcast signal and generating an automatic gain control signal for the first channel, and a controlling unit determining whether or not the signal strength and the automatic gain control signal satisfy preset requirements, respectively, and when satisfied, performing controlling to skip demodulation of the first channel.

The preset requirements may be that the signal strength is below a preset first reference value and the automatic gain control signal is equal to a preset second reference value or above.

The controlling unit may perform controlling to demodulate the first channel when the signal strength is equal to the first reference value or above or the automatic gain control signal is below the second reference value.

The demodulating unit may include a front unit generating the automatic gain control signal for the first channel, and a demodulator performing a demodulation locking for the first channel.

The front unit may generate the automatic gain control signal for the first channel when the first channel is set, and the demodulator may perform the demodulation locking for the first channel according to controlling of the controlling unit.

The apparatus may further include a decoding unit decoding a demodulation locked result for the first channel by the demodulating unit.

The decoding unit may store the first channel when the locking is successfully performed as a result of the decoding.

According to some embodiments of the present disclosure, an apparatus for receiving a broadcast signal may include a radio frequency (RF) receiving unit receiving a broadcast signal and detecting signal strength of the broadcast signal, a demodulating unit generating a plurality of automatic gain control signals for the plurality of respective channels included in the broadcast signal, and a controlling unit performing controlling to skip demodulation of at least a portion of the plurality of channels using the signal strength and the plurality of automatic control signals.

The controlling unit may perform controlling to skip demodulation of a corresponding channel when the signal strength is below a preset first reference value and the automatic gain control signal is equal to a preset second reference value or above.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
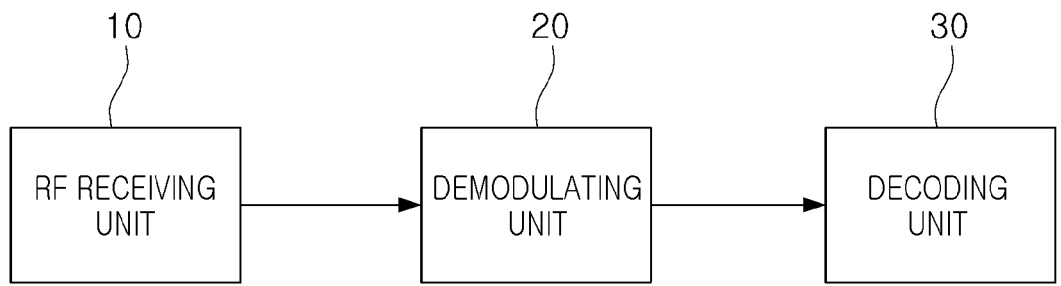
FIG. 1 is a block diagram illustrating an example of a general apparatus for receiving a broadcast signal.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Throughout the drawings, the same or like reference numerals will be used to designate the same or like elements.

FIG. 1 is a block diagram illustrating an example of a general apparatus for receiving a broadcast signal.

Referring to FIG. 1, an apparatus for receiving a broadcast signal may receive a broadcast signal through a radio frequency (RF) receiving unit 10. Here, the broadcast signal may include a plurality of channels.

A demodulating unit 20 may sequentially demodulate the plurality of channels of the broadcast signal. The demodulating unit 20 may demodulate one channel to provide the demodulated channel to a decoding unit 30, and when the decoding of the corresponding channel is completed, may demodulate a next channel to provide the demodulated channel to the decoding unit 30.

The decoding unit 30 may receive an output of the demodulating unit 20 to decode the output. When the decoding is successfully locked, the decoding unit 30 may store the corresponding channel.

In a case of one example of the apparatus for receiving a broadcast signal of FIG. 1 described above, all of the plurality of channels included in the broadcast signal need to be demodulated and decoded. For example, even in the case in which any broadcast information is not present in a specific channel, the corresponding channel may be required to be demodulated and decoded.

Therefore, the general apparatus for receiving a broadcast signal may necessarily take a long time in order to search the channel.

Therefore, the present disclosure may provide a channel searching method capable of skipping a channel in which broadcast information is not present and an apparatus for receiving a broadcast signal using the same.

Hereinafter, various examples of the present disclosure will be described with reference to FIGS. 2 through 6.

Figure 2:
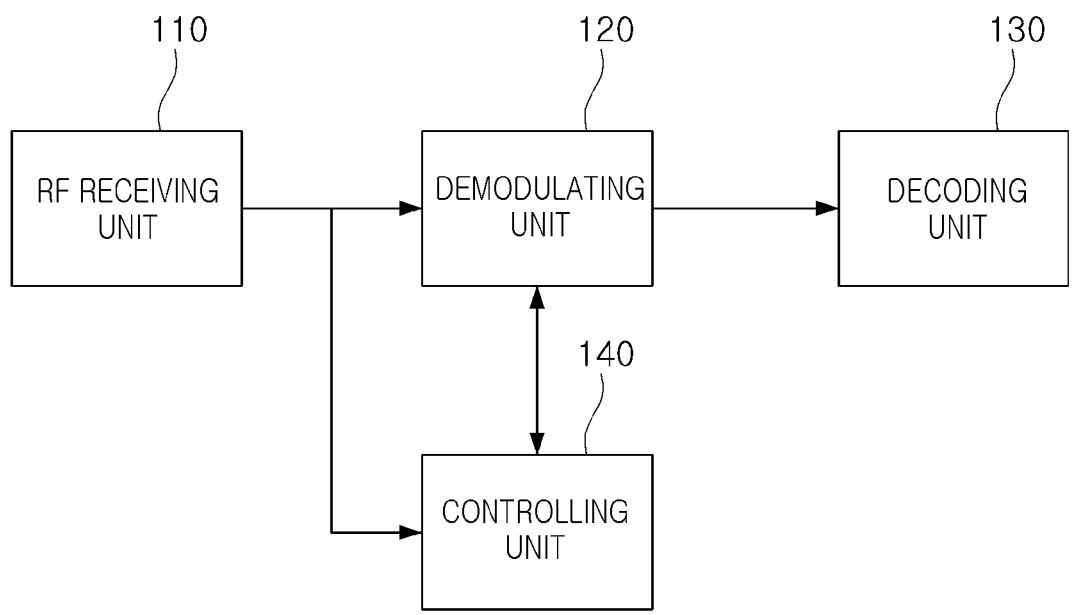
FIG. 2 is a block diagram showing an example of an apparatus for receiving a broadcast signal according to an exemplary embodiment of the present disclosure.
Figure 3:
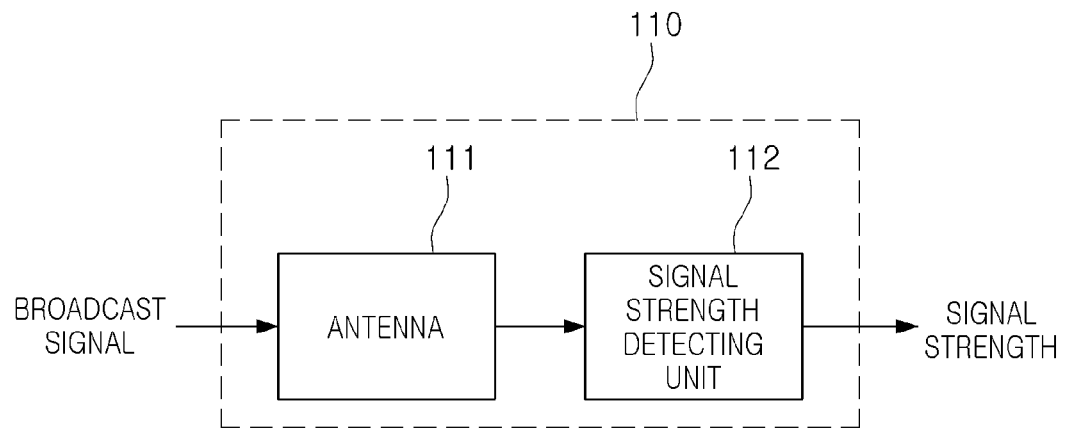
FIG. 3 is a block diagram illustrating an example of a radio frequency (RF) receiving unit of FIG. 2.
Figure 4:
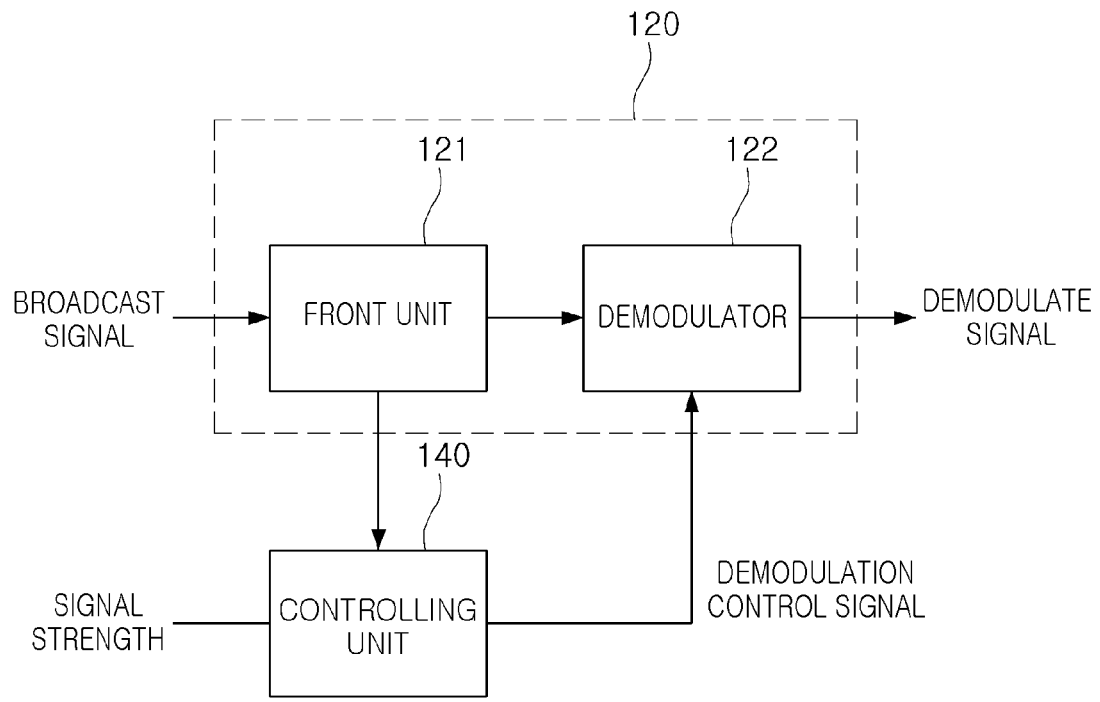
FIG. 4 is a block diagram illustrating an example of a demodulating unit of FIG. 2.

FIG. 2 is a block diagram illustrating an example of an apparatus for receiving a broadcast signal according to an exemplary embodiment of the present disclosure and FIG. 3 is a block diagram illustrating an example of a radio frequency (RF) receiving unit of FIG. 2. FIG. 4 is a block diagram illustrating an example of a demodulating unit of FIG. 2.

Referring to FIG. 2, the apparatus for receiving a broadcast signal may include a RF receiving unit 110, a demodulating unit 120, a decoding unit 130, and a controlling unit 140.

The RF receiving unit 110 may receive a broadcast signal and may detect signal strength of the broadcast signal. Here, the signal strength may be used as one factor determining a channel skip.

In one example, the signal strength may be a received signal strength indicator (RSSI).

Referring to the example of FIG. 3, the RF receiving unit 110 may include an antenna 111 and a signal strength detecting unit 112.

The antenna 111 may receive the broadcast signal and provide a received broadcast signal to the signal strength detecting unit 112, and the signal strength detecting unit 112 may detect signal strength of the received broadcast signal.

Referring back to FIG. 1, the demodulating unit 120 may generate a plurality of automatic gain control signals for the plurality of respective channels included in the broadcast signal and the controlling unit 140 may perform controlling to skip demodulation of at least a portion of the plurality of channels using the signal strength and the plurality of automatic gain control signals.

The demodulating unit 120 and the controlling unit 140 may be sequentially operated for the plurality of channels.

Hereinafter, operations of the demodulating unit 120 and the controlling unit 140 for one specific channel will be described for convenience of explanation.

The demodulating unit 120 may set a specific channel in the broadcast signal and may generate an automatic gain control signal for the specific channel. For example, the signal strength described above may be detected from the broadcast signal, while the automatic gain control signal may be generated for each channel.

Here, the automatic gain control signal may also be used as one factor determining the channel skip.

In one example, the automatic gain control signal may be an intermediate frequency-automatic gain control (IF-AGC) signal.

The demodulating unit 120 may demodulate the corresponding specific channel according to controlling of the controlling unit 140.

Describing one example of the demodulating unit 120 in more detail with reference to FIG. 4, the demodulating unit 120 may include a front unit 121 and a demodulator 122.

The front unit 121 may generate the automatic gain control signal for the specific channel.

In further detail, when the front unit 121 receives the broadcast signal, the front unit 121 may set a specific channel and may generate the automatic gain control signal for the corresponding specific channel. The front unit 121 may provide the generated automatic gain control signal to the controlling unit 140.

The demodulator 122 may perform a demodulation locking for the specific channel to output a demodulated signal.

In further detail, when the demodulator 122 receives a demodulation control signal to perform the demodulation from the controlling unit 140, the demodulator 122 may perform the demodulation locking for the corresponding specific channel in which the front unit 121 generates the automatic gain control signal.

In one example, the demodulator 122 may include both a digital demodulating module and an analog demodulating module. For example, the demodulator 122 may output both a demodulated digital MPEG (TS) and a demodulated analog video (CVBS).

The controlling unit 140 may determine whether or not the demodulation of the specific channel is skipped using the signal strength and the automatic gain control signal.

In detail, the controlling unit 140 may identify whether or not the signal strength and the automatic gain control signal each satisfy a preset requirement and may generate the demodulation control signal to skip the demodulation of the corresponding specific channel.

For example, assuming that the signal strength in the broadcast, for example, a level determining that the channel is present using the RSSI is set to 0 to −75 dBm, when the automatic gain control signal, for example, an IF AGC value is segmented into 0 to 100 steps, 0 to 90 steps may be determined as those in which the signal is present and 91 to 100 steps may be set as those in which the signal is not present.

In this example, in the case in which a noise is amplified by an amplification process of a relay despite the broadcast channel which is not present, the RSSI may determine that the channel is present. For example, when the noise is amplified to be measured as −70 dBm, the channel may be determined as being present by a RSSI determination reference. However, since the IF AGC uses a filtered signal, the amplified noise may be determined as being the case in which the signal is not present. Therefore, in the case of the example described above, since a value of output IF AGC becomes 100, this may be determined that the signal is not generally present.

As a result, the determination by only the signal strength may cause misrecognition for the channel. However, since the example according to the present disclosure considers the signal strength together with the automatic gain control, whether or not the channel is present may be determined.

In one example, the preset requirement may be that the signal strength is below a preset first reference value and the automatic gain control signal is equal to a preset second reference value or above. For example, when the signal strength of the broadcast signal is below the first reference value and the automatic gain control signal for the specific channel is equal to the second reference value or above, the controlling unit 140 may determine that effective broadcast information is not present in the corresponding specific channel and perform controlling to skip the demodulation of the corresponding specific channel.

In this case, since the specific channel in which the broadcast information is not present is not demodulated and decoded, the entire searching time of the broadcast signal may be reduced.

The decoding unit 130 may decode a demodulation locked result for the specific channel of the demodulating unit 120.

When the decoding is successfully locked as a result of the decoding, the decoding unit 130 may store the corresponding specific channel.

Figure 5:
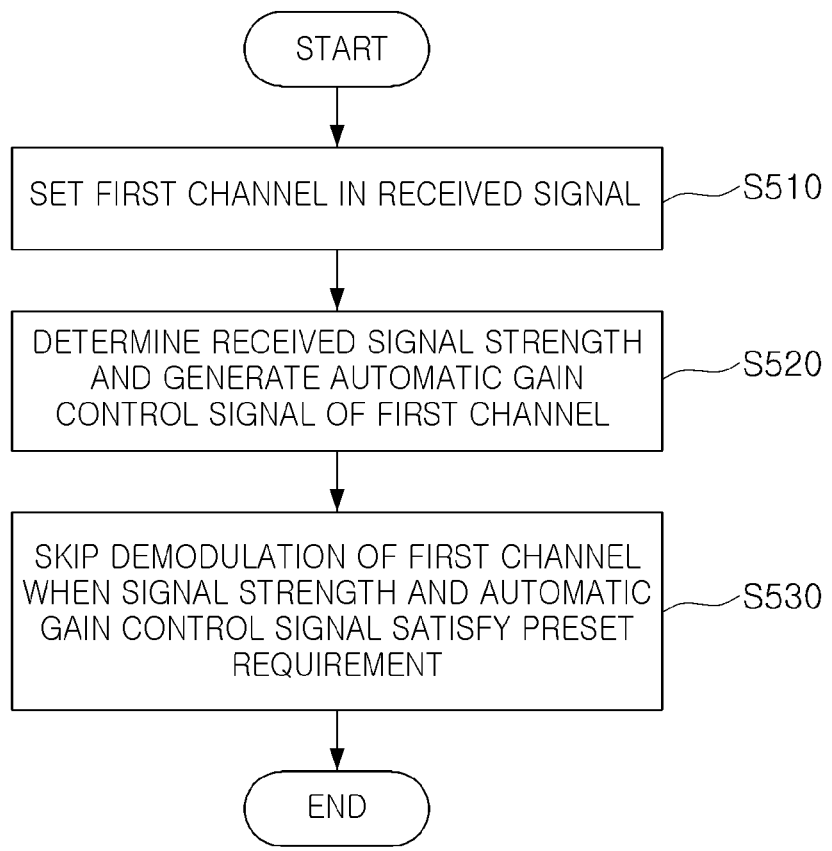
FIG. 5 is a flow chart illustrating an example of a channel searching method according to an exemplary embodiment of the present disclosure.
Figure 6:
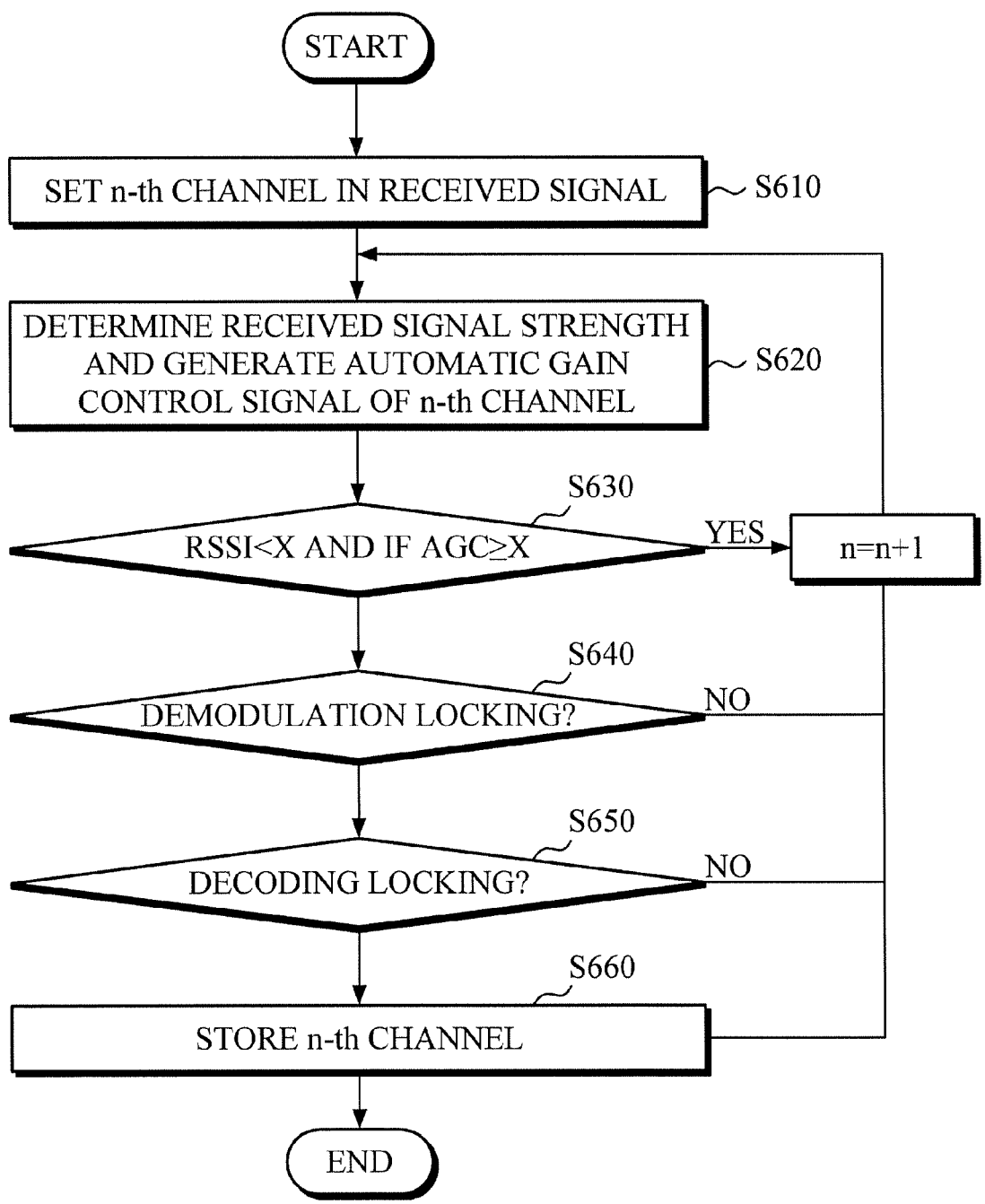
FIG. 6 is a flow chart illustrating another example of a channel searching method according to an exemplary embodiment of the present disclosure.

FIG. 5 is a flow chart illustrating an example of a channel searching method according to an exemplary embodiment of the present disclosure and FIG. 6 is a flow chart illustrating another example of a channel searching method according to an exemplary embodiment of the present disclosure.

Since the examples of channel searching methods illustrated in FIGS. 5 and 6 are performed by the apparatus for receiving a broadcast signal described above with reference to FIGS. 2 through 4, a description of contents that are the same as or correspond to the above-mentioned contents will be omitted in order to avoid an overlapped description.

One example of FIG. 5 is to describe a channel searching method determining whether or not a demodulation is skipped for one channel.

Referring to FIG. 5, in one example of the channel searching method, the apparatus for receiving a broadcast signal may set a first channel in a broadcast signal (S510).

Next, the apparatus for receiving a broadcast signal may detect signal strength for the broadcast signal and may generate an automatic gain control signal for the first channel (S520).

When the signal strength satisfies a preset first requirement and the automatic gain control signal satisfies a preset second requirement, the apparatus for receiving a broadcast signal may skip demodulation of the first channel (S530).

FIG. 6 is a flow chart illustrating another example of a channel searching method according to an exemplary embodiment of the present disclosure. Another example of FIG. 6 is to describe a channel searching method which is continuously operated for a plurality of channels.

Referring to FIG. 6, the apparatus for receiving a broadcast signal may set an n-th channel in a broadcast signal (S610).

The apparatus for receiving a broadcast signal may determine signal strength of the broadcast signal and generate an automatic gain control signal for the n-th channel (S620).

Next, the apparatus for receiving a broadcast signal may determine whether or not a demodulation of the n-th channel is skipped. In detail, the apparatus for receiving a broadcast signal may determine whether or not the signal strength is below a preset first reference value and the automatic gain control signal is equal to a preset second reference value or above (S630). FIG. 6 describes an example using RSSI as the signal strength and IF AGC as the automatic gain control signal.

When the condition described above is satisfied (YES of S630), the apparatus for receiving a broadcast signal may skip the demodulating for the corresponding n-th channel and may set a next channel (i.e., an n+1-th channel) (S670).

When the condition described above is not satisfied (NO of S630), the apparatus for receiving a broadcast signal may determine that broadcast information is present in the corresponding n-th channel.

Next, the apparatus for receiving a broadcast signal may determine whether or not a demodulation locking is performed for the corresponding n-th channel (S640). When the demodulation locking is not performed, this indicates that effective broadcast information is not present in the corresponding n-th channel. Therefore, the apparatus for receiving a broadcast signal may set a channel after next (i.e., an n+1-th channel) (S670).

When the demodulation locking for the corresponding n-th channel is effectively performed (S640), the apparatus for receiving a broadcast signal may determine whether or not a decoding locking is performed for the corresponding n-th channel (S650). Here, when the decoding locking is effectively performed (YES of S650), this indicates that the effective broadcast information is present in the corresponding n-th channel. Therefore, the apparatus for receiving a broadcast signal may store the n-th channel (S660) and repeat the above-mentioned processes for the next channel.

According to exemplary embodiments of the present disclosure, the channel may be more rapidly searched by determining whether or not effective broadcast data is present in the corresponding channel using the signal strength of the broadcast signal and the automatic gain control signal of the channel and when the broadcast data is not present in the corresponding channel, by skipping the corresponding channel.

While exemplary embodiments have been shown and described above, it will be apparent to those skilled in the art that modifications and variations could be made without departing from the spirit and scope of the present disclosure as defined by the appended claims.

What is claimed is:

1. A channel searching method, comprising:
    setting a first channel in a broadcast signal;
    determining signal strength of the broadcast signal and generating an automatic gain control signal for the first channel; and
    when the signal strength is below a preset first reference value and the automatic gain control signal is equal to a preset second reference value or above, skipping demodulation of the first channel.

2. The channel searching method of claim 1, wherein the skipping of the demodulation of the first channel comprises:
    determining whether or not the signal strength is below the preset first reference value; and
    determining whether or not the automatic gain control signal is equal to the preset second reference value or above.

3. The channel searching method of claim 1, further comprising, when skipping the demodulating for the first channel, setting a second channel and repetitively determining whether or not demodulating of the second channel should be skipped.

4. The channel searching method of claim 1, further comprising, when the signal strength is below the preset first reference value and the automatic gain control signal is below the present second reference value, demodulating the first channel.

5. The channel searching method of claim 4, wherein the demodulating of the first channel comprises:
    when the signal strength is below the present first reference value and the automatic gain control signal is below the present second reference value, determining whether or not the demodulation is locked for the first channel; and
    when the demodulation is locked, determining whether or not decoding is locked for locked demodulation data.

6. The channel searching method of claim 5, wherein the demodulating of the first channel further comprises storing the first channel when the decoding is locked.

7. An apparatus for receiving a broadcast signal, the apparatus comprising:
    a radio frequency (RF) receiving unit receiving a broadcast signal and detecting signal strength of the broadcast signal;
    a demodulating unit setting a first channel in the broadcast signal and generating an automatic gain control signal for the first channel; and
    a controlling unit performing controlling to skip demodulation of the first channel when the signal strength is below a present first reference value and the automatic gain control signal is equal to a present second reference value or above.

8. The apparatus of claim 7, wherein the controlling unit performs controlling to demodulate the first channel when the signal strength is equal to the first reference value or above or the automatic gain control signal is below the second reference value.

9. The apparatus of claim 7, wherein the demodulating unit includes:
    a front unit generating the automatic gain control signal for the first channel; and
    a demodulator performing a demodulation locking for the first channel.

10. The apparatus of claim 9, wherein the front unit generates the automatic gain control signal for the first channel when the first channel is set, and the demodulator performs the demodulation locking for the first channel according to controlling of the controlling unit.

11. The apparatus of claim 7, further comprising a decoding unit decoding a demodulation locked result for the first channel by the demodulating unit.

12. The apparatus of claim 11, wherein the decoding unit stores the first channel when the locking is successfully performed as a result of the decoding.

13. An apparatus for receiving a broadcast signal, the apparatus comprising:
    a radio frequency (RF) receiving unit receiving a broadcast signal and detecting signal strength of the broadcast signal;
    a demodulating unit generating a plurality of automatic gain control signals for the plurality of respective channels included in the broadcast signal; and
    a controlling unit performing controlling to skip demodulation of at least a portion of the plurality of channels when the signal strength is below a preset first reference value and the automatic gain control signal is equal to a present second reference value or above.

* * * * *